United States Patent [19]

Graebner et al.

[11] Patent Number: 5,328,550
[45] Date of Patent: Jul. 12, 1994

[54] THINNING A DIAMOND BODY BY MEANS OF MOLTEN RARE-EARTH-CONTAINING ALLOYS

[75] Inventors: John E. Graebner, New York, N.Y.; Sungho Jin, Millington; Mark T. McCormack, Summit, both of N.J.

[73] Assignee: AT&T Bell Laboratories, Murray Hill, N.J.

[21] Appl. No.: 955,634

[22] Filed: Oct. 2, 1992

[51] Int. Cl.$^5$ .............................. H01L 21/00
[52] U.S. Cl. ................... 156/628; 156/60; 156/625; 156/629; 156/650
[58] Field of Search ............... 156/625, 628, 650, 629, 156/60

[56] References Cited

FOREIGN PATENT DOCUMENTS 63-144940 6/1988 Japan.
206190A 5/1981 United Kingdom.

OTHER PUBLICATIONS

"Diamond Growth Rates", 1971; J. Phys. Chem., 75 (12); Wentorf; pp. 1833–1837.
"Wettability and Contact Interaction of Metallic Melts With Diamond and Cubic Boron Nitride".
Lint, Almazy Prom-Sti, Doke Nauchn, Loobhch, for Zarut. Uch. Spets.; Mezhelumer. Konf; Meeting Date 1971; 32–6; 1971; abstract only.
"Classification of Phase Diagrams of Metal–Carbon Systems in Relation to Diamond Synthesis"; Butylenko et al.; 1977; Lint Almozey, (4); 9–13, abstract only.
"Importance of the Experimental Growth and Dissolution of Diamond Crystals In Metal-Carbon Systems for Understanding Some Aspects of Natural Diamond origin"; Eksp. Issled. Mineroloobrozov Dukhikh Okisnykh Lilkot List; Litvin et al.; 1972; abstract only.
"Adhession Interaction and Contact Entectie Melting of Diamond With Metals"; Sim Almazy, 3(6), 1971, abstract only.
"Development and Performance of a Diamond Film Polishing Apparatus with Hot Metals"; S.P.I.E., vol. 1325, Diamond Optics; 1990; Yoskikaory; pp. 210–219.
"Polishing of CVD Diamond Film"; 1991; Tzeng et al.; "Applications of Diamond Films" and Related Materials; pp. 241–248.
Graebner, J. E. et al., "Unusually High Thermal Conductivity in Diamond Films," Applied Physics Letters, vol. 60, pp. 1576–1578 (Mar. 30, 1992).
Jin, S. et al., "Massive Thinning of Diamond Films by a Diffusion Process," Applied Physics Letters, vol. 60, pp. 1948–1950 (Apr. 20, 1992).
U.S. Ser. No. 07/908130 to Dautremont-Smith, W. C. et al. Application Pending filed on Jul. 2, 1992.
U.S. Ser. No. 07/08202470 to Graebner, J. E. et al. Application Pending filed on Jan. 17, 1992.

Primary Examiner—R. Bruce Breneman
Assistant Examiner—George Goudreau
Attorney, Agent, or Firm—David I. Caplan

[57] ABSTRACT

A diamond body, such as a CVD diamond film, is thinned by placing the body—at an elevated temperature and under pressure—in contact with a molten or partially molten alloy of a rare earth metal and a metallic impurity that lowers the melting point of the rare earth metal. Typically, the rare earth metal is cerium and the impurity is nickel.

The pressure is typically less than approximately 0.2 MPa (Mega Pascal), preferably less than approximately 0.02 MPa, and the temperature is within a range whose lower limit is approximately 100 C. degrees below the melting point of the alloy of the rare earth plus impurity metal.

22 Claims, 1 Drawing Sheet

THINNING A DIAMOND BODY BY MEANS OF MOLTEN RARE-EARTH-CONTAINING ALLOYS

TECHNICAL FIELD

This invention relates to methods of etching (or "thinning"), and more particularly to methods of removing material from a diamond body.

BACKGROUND OF THE INVENTION

A diamond body, including a free-standing (stand-alone) CVD (chemical vapor deposited) diamond film, is useful in a variety of contexts, such as a heat-spreading submount for a semiconductor laser chip or a semiconductor integrated circuit chip. Presently available free-standing CVD films typically exhibit an undesirably relatively rough (large grain) top surface and a relatively smooth (small grain), but undesirably relatively low thermal conductivity, bottom surface. The thermal conductivity thus has a gradient going from the top to the bottom surface. As described in a paper by J. E. Graebner et al., published in *Applied Physics Letters*, Vol. 60, pp. 1576–1578 (Mar. 30, 1992), entitled "Unusually High Thermal Conductivity in Diamond Films," this gradient is believed to be attributable to a cone-shaped columnar crystal structure of the film, the cones having their vertices located at or near the bottom surface of the film at its interface with an underlying substrate on which the film has been grown. Those of the columnar cones that extend all the way to the top surface of the film have less sub-structure than those that do not. This type of microstructure causes an undesirably low average transverse (spreading) thermal conductivity of the diamond film at its bottom regions, as well as poor thermal contact with, for example, a laser chip located on the rough top surface of the diamond film. Likewise, there can arise a problem of poor thermal contact of the rough bottom surface of the diamond film with a metallic or ceramic heatsinking mount ("stud"). Thus, removal of a thickness of diamond material from its top and bottom surfaces is desirable.

The paper "Massive thinning of diamond films by a diffusion process," authored by S. Jin et al, and published in *Applied Physics Letters*, Vol. 60, pp. 1948–1950 (Apr. 20, 1992) teaches a technique for removing diamond material simultaneously from top and bottom regions of a free-standing CVD diamond film, in order to smoothen the top surface and at the same time to remove undesirably low thermal conductivity material located at the bottom surface. In accordance with that technique, the free-standing diamond film is sandwiched between a pair of thin iron sheets (foils) and heat treated at 900° C. under a constant stress for a time duration of 48 hours in an argon gas atmosphere. Although the technique is useful for its intended purpose, namely, thinning the CVD diamond film by approximately 100 $\mu$m (50 $\mu$m on each main face), a lower temperature and a shorter time duration would be desirable, especially from an economic standpoint. Furthermore, the required application of high pressure—typically approximately 20 MPa (20 Mega Pascal) for the case of etching with iron, in order to ensure good contact between the solid metal and diamond surfaces during heat treatment—is not desirable from an industrial point of view. Therefore, a faster, lower temperature, and lower pressure method of removing (diamond) material from a face of diamond body is desirable, at little or no sacrifice of surface smoothness.

SUMMARY OF THE INVENTION

In order to reduce the temperature, pressure, and time required for thus removing material from a face of a diamond body—such as, for example, for thinning a free-standing CVD diamond film—in accordance with the invention we provide a method comprising the steps of (a) maintaining for a prescribed time duration at least a portion of the face in direct physical contact with a molten or partially molten metallic alloy of a rare earth metal and a metallic impurity that reduces the melting point of the rare earth metal, the alloy having the property of dissolving carbon; and (b) maintaining, during the prescribed time duration, the molten or partially molten alloy within a prescribed temperature range, whereby a thickness of the body located at the portion of the face thereof is removed.

As used herein, the "rare earth" can be a combination of rare earth metals, and the "impurity" can be a combination of metallic impurities.

The prescribed temperature range advantageously includes, in addition to temperatures above the melting point of the metallic alloy (i.e., of the rare earth and metallic impurity), a lower range of temperatures below the melting point of the alloy within which the molten metallic alloy with carbon (viz., from the diamond) dissolved in it coexists with the solid metallic alloy with (a typically different concentration of) carbon dissolved in it (viz. in the solid metallic alloy). For convenience, this lower range of temperatures will be called the range of "partial melting temperatures" (of the metallic alloy plus dissolved carbon), and any temperature within this lower range will be called a "partial melting temperature" (of the metallic alloy plus dissolved carbon).

In this way, the required processing time duration can be reduced by a factor of approximately 5 or more, the required temperature can be reduced by as much as 200 C. degrees or more, and the required pressure can be reduced by a factor of as much as 100 or more. For example, it is advantageous that during step (b) a pressure of less than approximately 0.2 MPa, preferably less than approximately 0.02 MPa, is applied to the molten or partially molten metal.

Although it should be understood that any advantage of this invention does not depend on the correctness of any theory, it is believed that the required time duration of the etching process of this invention is thus reduced because the diffusion of carbon in a molten or partially molten metal or metallic alloy is a speedier process than the diffusion of carbon in a solid metal or metallic alloy having the identical chemical composition.

It is further advantageous that more than one diamond body thus be simultaneously maintained in contact with sandwiched layers or a bath formed by the molten or partially molten metallic alloy, in order to achieve batch processing. It is further advantageous that the prescribed temperature range have a lower limit that is higher than the partial melting temperature in a metal-carbon system, typically approximately 100 C. degrees below the melting point of the alloy of rare earth metal plus impurity metal. It is also advantageous that the rare earth is cerium (Ce) or lanthanum (La). It is further advantageous that the impurity is nickel (Ni), copper (Cu), cobalt (Co), aluminum (Al), or silver (Ag).

The use of more than a single such impurity in the metallic alloy can, in some cases, desirably reduce the melting temperature of the metallic alloy still further. It is also advantageous that in case of cerium as the sole rare earth in the metallic alloy that the temperature range has a lower limit of approximately 300° C. and an upper limit of approximately 1,000° C., preferably a lower limit of approximately 400° C. and an upper limit of approximately 750° C.

The lowering of the melting points of the rare earth metals by alloying with the metallic impurities thus allows the diamond-thinning process to be performed at substantially lower temperatures than the rare earth metals alone. Such lower processing temperatures are desirable for ease of processing, especially in industrial practice, not only for the sake of convenience but also for minimizing possible damage to the diamond film during the relatively high temperatures required for thinning the diamond film (either across the entire face of the diamond film or in accordance with a desired spatial pattern). Such damage is of special concern when the diamond film is to be used for diamond-based semiconductor devices: such devices typically contain added dopants and metallizations that can be harmed by the higher processing temperatures required when using pure rare earths.

Some of the exemplary metallic impurities (such as Ni, Co, Ag, Al) contained in the alloy mixtures contribute to improved corrosion resistance (as compared with pure rare earth metals). Moreover, pure rare earths are so reactive that they often can oxidize so rapidly in air that they cannot be handled safely (in air) because of fire hazards. Some of the alloys containing the exemplary impurities (mentioned above) are so much less prone to oxidation that a significantly smaller amount of care is needed for desirably easier and safer handling.

It is further advantageous that, subsequent to thinning the diamond body, one or more electronic devices—such as one or more semiconductor integrated circuit chips or one or more semiconductor lasers—is bonded to a thinned portion of the surface of the body, and that another portion of the body is bonded to a heat-sinking body such as copper.

Figure 1:
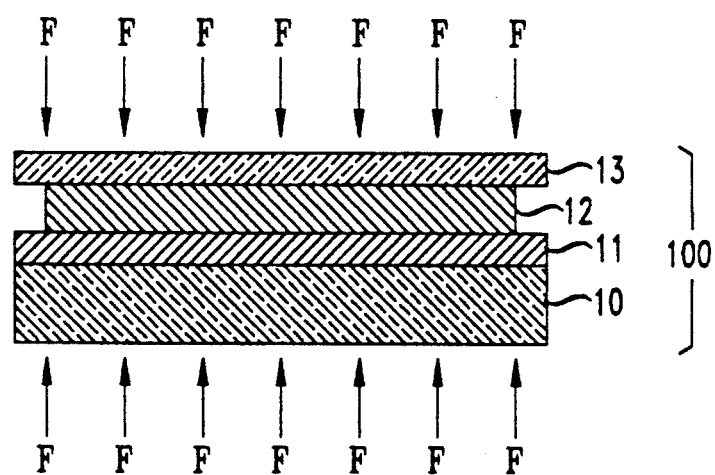
FIG. 1 is an elevational view in cross section of a diamond film being etched in accordance with a specific embodiment of the invention.

Only for the sake of clarity none of the drawings is to any scale.

DETAILED DESCRIPTION

A free-standing CVD diamond film 10 (FIG. 1) has a top surface which is to be etched. A flat metallic layer 11 is located on this top surface. Advantageously, the metallic layer 11 is an alloy of a rare earth metal, such as cerium, or lanthanum, together with an impurity metal, such as nickel.

Upon the metallic layer 11 is located a flat buffer layer 12—for example, molybdenum—and a flat plate 13—for example, alumina. The buffer layer 12 is advantageously chemically nonreactive. Typically, the buffer layer 12 has a thickness of approximately 20 $\mu$m; and the flat plate 13 typically has a thickness of approximately 500 $\mu$m. The purpose of the buffer layer 12 is to prevent reaction of rare earth or other metal with the alumina, especially at the elevated temperatures to be used for melting or partially melting the rare earth in the layer 11. The purpose of the flat plate 13 is to supply rigid mechanical support.

The resulting assembly 100 is subjected to a set of relatively small compressive forces F, to produce a pressure p of typically less than approximately 0.2 MPa, preferably less than approximately 0.02 MPa. In any event, the pressure p is sufficient to produce a mechanically stable assembly and to promote uniformly good wetting of the top surface of the diamond film 10 when the metallic layer 11 is heated to an elevated temperature T and becomes molten or at least partially molten. At this elevated temperature T, the molten or partially molten metal wets the top surface of the diamond film 10 and begins to react with it. Thus further application of the pressure p is not necessary, but optionally the pressure p can continue to be applied. As a result, carbon is dissolved from the top face of the diamond film 10. Hence the thickness of the film 10 is reduced when the assembly 100 is heated to the elevated temperature T; i.e., the film is etched, as is desired, by maintaining it at the elevated temperature T for a prescribed time duration.

EXAMPLE 1

The CVD diamond film 10 had a thickness of approximately 250 $\mu$m prior to the etching. The metallic alloy layer 11 was an alloy of essentially pure cerium and 11.2 weight percent nickel—an alloy which had a melting point of approximately 480° C., i.e., approximately 300 C. degrees below that of pure cerium. The initial thickness of the alloy layer 11 was approximately 1 mm. The set of compressive forces F was adjusted to produce a pressure p of approximately 10 KPa (=0.01 MPa). The assembly 100 was heated in an argon atmosphere in a furnace (not shown) to an elevated temperature T that was equal to approximately 690° C. The furnace, with the assembly inside, was maintained at this temperature T for (an etching time duration of) approximately 36 hours, and then the furnace was cooled to room temperature. The diamond film 10, with reacted metal on its top surface, was then wet etched in warm nitric acid, typically approximately 50 molar percentum nitric acid at a temperature in the approximate range of 50° C. to 60° C., typically for approximately 0.5 hour, in order to remove any residual cerium or nickel in the film 10. The diamond film 10 was then washed and dried.

As a result of the foregoing procedure, the final thickness of the diamond film 10 became equal to approximately 195 $\mu$m; that is, the film 10 underwent a thickness reduction that was equal to approximately (250 $\mu$m − 195 $\mu$m) = 55 $\mu$m. At the same time, surface roughness of the top surface of the diamond film 10 was significantly reduced.

EXAMPLE 2

The furnace was maintained at an elevated temperature of approximately T = 590° C. for (an etching time duration of) approximately 36 hours. All other parameters and procedures were the same as recited in Example 1 above. In this way, the thickness reduction was equal to approximately 18 $\mu$m. Again the top surface roughness was significantly reduced.

EXAMPLE 3

The furnace was maintained at an elevated temperature of 590° C. for (an etching time duration of) approximately 77 hours. All other parameters and procedures were the same as recited in Example 1 above. In this way, the thickness reduction was equal to approximately 40 μm. Again, the top surface roughness was significantly reduced.

By way of comparison and control, an experiment was performed in which the metallic layer 11 was essentially pure cerium (with essentially no added metallic impurity). and the furnace was maintained at the same temperature as in Example 1—viz., approximately 690° C.—for the same time duration—viz., approximately 36 hours. There was no measurable reduction in the thickness of the diamond film, as the processing temperature (approximately 690° C.) was well below the melting point of pure cerium (approximately 798° C.). The roughness of the top surface of the film was the same after the processing (using cerium at 690° C. for 36 hour) as it was before the processing.

Although the invention has been described in detail with respect to specific embodiments, various modifications can be made without departing from the scope of the invention.

Instead of using argon, other inert or reducing atmospheres, such as helium or hydrogen, can be used. Alternatively, a mixture of hydrogen and methane ($CH_4$) can be used. Also, instead of cerium, other rare earth metals can be used, such as La, Yb, Pr, or Eu. In the case of lanthanum as the sole rare earth, it is advantageous that the temperature range have a lower limit of approximately 400° C. and an upper limit of approximately 1,000° C., preferably a lower limit of approximately 450° C. and an upper limit of approximately 800° C.

Also, instead of nickel as the metallic impurity, other metallic impurities (or combinations thereof) that lower the melting point of rare earth metals can be used—such as Co, Ag, Cu, Zn, Al, Ga, Fe, Mn, Pd, Pt, Ru, Rh, In, Si, Ge, Au, and Mg. For example, the following alloys can be used: Ce with approximately 15 weight-percent Cu (approximate melting point=424° C.), Ce with approximately 9 weight-percent Zn (approximate melting point=495° C.), La with approximately 16 weight-percent Co (approximate melting point=500° C.), Yb with approximately 14 weight-percent Ag (approximate melting point=446° C.)—each of these alloys exhibiting a melting point that is more than 200 C. degrees lower——and in some cases even 300 C. degrees lower—than the pure rare earth metal in it.

One or more than one rare earth metal can be used in the alloy mixture, in combination with one or more than one metallic impurity—the quantitative composition depending on the desired melting point, desired corrosion resistance, and other desired physical characteristic (if any). A useful approximate composition range of each metallic impurity in the alloy mixture is 2-to-50 weight-percent; an advantageous approximate range is 5-to-30 weight-percent; and a preferred approximate range is 10-to-20 weight-percent.

The alloy mixture can be provided in the form of sheets, blocks, or powders. Alternatively, flood-deposited or spatially-selectively-deposited alloys can be used respectively for entire-surface-etching (thinning) or for spatially-selective-surface-etching (localized patterning; local thinning) of the diamond body. Such depositions can be performed by means of physical deposition (e.g., sputtering or evaporation) or by means of chemical deposition (e.g., electroplating or electroless plating).

Moreover, in case it is desired to thin the diamond film 10 by etching both its top and bottom surfaces, the diamond film 10 can be symmetrically sandwiched (on its top and bottom surfaces) between successive layers of cerium-nickel, buffer layer (e.g., molybdenum), and flat plate (e.g., alumina). Furthermore, the rate of dissolution of the diamond film in the molten or partially molten alloy can be controlled to a more nearly constant rate by continuous removal of the dissolved carbon as volatile methane, such as by means of permeating or bubbling hydrogen through the molten rare earth while the film is suspended or otherwise immersed in the molten or partially molten alloy in a container under a prescribed pressure. The substrate (not shown) on which the diamond film was originally grown can remain intact or partly intact on the bottom surface of the film, if needed.

More than one diamond body can be simultaneously etched by using either a molten bath of the metallic mixture or by a configuration of layers of molten or partially molten metallic mixtures sandwiched between stacked films of diamond.

Desirable etching time durations can be in the approximate range of 0.01 to 1000 hours, preferably 0.1 to 100 hours, depending on the elevated temperature T and the desired amount of reduction in thickness of the diamond film.

After the etching has been completed and the diamond film has been taken out of the furnace, any residual unreacted or reacted metal can be removed by chemical etching or mechanical polishing. The etched diamond surface can be given additional finishing processing steps, such as local-area or entire-area mechanical or laser polishing, to achieve smoother surfaces or to impart fine geometrical patterns. A laser device or a semiconductor integrated circuit device can then be bonded to the etched and polished diamond film serving as a submount, with the diamond film being bonded to a metallic heat-sinking body. Alternatively, both a laser and a photodetector device can be bonded to the etched and polished diamond film, with the etching of the film being patterned as disclosed in copending U.S. patent application Ser. No. 07/908130; pending.

The technique of this invention may also be applied to single crystalline or polycrystalline diamond bodies or pieces, natural or synthetic, for the purpose of shaping or patterning them.

We claim:

1. A method of removing a thickness of material from a diamond body having at least one face, including the steps of
    (a) maintaining at least a portion of the face in direct physical contact with a molten or partially molten metallic alloy of one or more than one rare earth metal and one or more than one metallic impurity that reduces the melting point of the rare earth metal, the alloy either having the property of dissolving carbon or containing carbon and having the property of dissolving carbon; and
    (b) maintaining, during step a, the molten or partially molten alloy within a temperature range, whereby a thickness of the body located at the portion of the face thereof is removed.

2. The method of claim 1 in which the temperature range has a lower limit that is higher than about 100 C. degrees below the melting temperature of the alloy.

3. The method of claim 2 in which the lower limit is higher than the partial melting temperature of the alloy plus dissolved carbon.

4. The method of claim 1 in which the alloy contains an amount of the one or more than one metallic impurity in the range of about 2-to-50 weight-percentum.

5. The method of claim 4 in which the range is about 5-to-30 weight-percentum.

6. The method of claim 5 in which the range is about 10-to-20 weight-percentum.

7. The method of claim 1 in which essentially only one rare earth is present in the alloy.

8. The method of claim 7 in which the rare earth is cerium.

9. The method of claim 8 in which the temperature range has a lower limit of about 400° C. and an upper limit of about 750° C.

10. The method of claim 8 in which the lower limit is about 300° C. and the upper limit is about 1,000° C.

11. The method of claim 8 in which the impurity comprises nickel.

12. The method of claim 8 in which the alloy contains nickel in a weight concentration in the range of about 10 and 20 weight-percentum.

13. The method of claim 8 in which the alloy contains nickel in a weight concentration in the range of about 2 and 50 weight-percentum.

14. The method of claim 8 in which the alloy contains nickel in a weight concentration in the range of about 5 and 30 weight-percentum.

15. The method of claim 1 in which the molten or partially molten alloy forms a bath, and steps (a) and (b) are simultaneously performed with another diamond body while it is located in the bath.

16. The method of claim 1 in which the molten or partially molten alloy forms layers sandwiched between multiple films of diamond, whereby steps (a) and (b) are performed on all the films simultaneously.

17. The method of claim 1 in which during step (b) a pressure is applied that is less than about 0.2 MPa.

18. The method of claim 1 in which during step (b) a pressure is applied that is less than about 0.02 MPa.

19. The method of making a device assembly in accordance with the steps recited in claim 1 further including, following the step (b), the step of bonding an electronic device to the portion of the face.

20. The method of claim 19 further including the step of bonding a heat-sinking body to the diamond body.

21. The method of claim 1, 2, 3, 4, 5, or 6 in which the diamond body is polycrystalline.

22. The method of claim 1, 2, 3, 4, 5, or 6 in which the diamond body is formed by chemical vapor deposition.

* * * * *

UNITED STATES PATENT AND TRADEMARK OFFICE
CERTIFICATE OF CORRECTION

PATENT NO. : 5,328,550
DATED : July 12, 1994
INVENTOR(S) : John E. Graebner, et al.

It is certified that error appears in the above-indentified patent and that said Letters Patent is hereby corrected as shown below:

Column 2, line 15, after "alloy" insert --either--.
Column 2, line 16, after "carbon" insert --or containing carbon and having the property of dissolving carbon--.

Signed and Sealed this

Third Day of January, 1995

Attest:

BRUCE LEHMAN

Attesting Officer

Commissioner of Patents and Trademarks